US012787743B2

(12) United States Patent
Jiang et al.

(10) Patent No.: US 12,787,743 B2
(45) Date of Patent: Nov. 3, 2026

(54) METHODS, SYSTEMS, APPARATUS, AND ARTICLES OF MANUFACTURE TO PRODUCE INTEGRATED CIRCUIT PACKAGES WITH GROUNDING MEMBERS

(71) Applicant: Intel Corporation, Santa Clara, CA (US)

(72) Inventors: Zhenguo Jiang, Chandler, AZ (US); Zhiguo Qian, Chandler, AZ (US); Jiwei Sun, Chandler, AZ (US); Babita Dhayal, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 139 days.

(21) Appl. No.: 17/954,174

(22) Filed: Sep. 27, 2022

(65) Prior Publication Data

US 2024/0105577 A1 Mar. 28, 2024

(51) Int. Cl.

*H10W 20/20* (2026.01)
*H10D 62/17* (2025.01)
*H10W 90/20* (2026.01)
*H10W 20/41* (2026.01)

(52) U.S. Cl.

CPC ...... *H10W 20/2134* (2026.01); *H10D 62/378* (2025.01); *H10W 90/297* (2026.01); *H10W 20/427* (2026.01)

(58) Field of Classification Search

CPC ............. H10W 20/2134; H10W 20/20; H10W 20/023–0265; H10W 20/427; H10W 90/297; H10W 20/42; H10W 20/422; H01L 21/76898; H01L 23/481; H01L 23/5286; H01L 2225/06541

See application file for complete search history.

(56) References Cited

U.S. PATENT DOCUMENTS

| | | | | |
|---|---|---|---|---|
| 2011/0233785 | A1* | 9/2011 | Koester | H10W 20/023 257/E21.585 |
| 2014/0225246 | A1* | 8/2014 | Henderson | H10W 20/427 257/691 |
| 2018/0145030 | A1* | 5/2018 | Beyne | H10D 84/0186 |
| 2023/0378026 | A1* | 11/2023 | Kuo | H10W 20/20 |

* cited by examiner

*Primary Examiner* — Yu Chen

(74) *Attorney, Agent, or Firm* — Hanley, Flight & Zimmerman, LLC

(57) ABSTRACT

Methods, systems, apparatus, and articles of manufacture to produce integrated circuit packages with grounding members are disclosed. An example semiconductor die disclosed herein includes a semiconductor substrate, metal interconnects proximate a first side of the semiconductor substrate, a metal contact proximate a second side of the semiconductor substrate opposite the first side, a first grounding member extending from a grounding interconnect of the metal interconnects to a first distal point in the semiconductor substrate, and a second grounding member extending from the metal contact to a second distal point in the semiconductor substrate, the first distal point closer to the first side of the semiconductor substrate than the second distal point is to the first side of the semiconductor substrate.

21 Claims, 9 Drawing Sheets

METHODS, SYSTEMS, APPARATUS, AND ARTICLES OF MANUFACTURE TO PRODUCE INTEGRATED CIRCUIT PACKAGES WITH GROUNDING MEMBERS

FIELD OF THE DISCLOSURE

This disclosure relates generally to integrated circuits and, more particularly, to methods, systems, apparatus, and articles of manufacture to produce integrated circuit packages with grounding members.

BACKGROUND

In many integrated circuit (IC) packages, one or more semiconductor dies are mechanically and electrically coupled to an underlying package substrate. Many such semiconductor dies include one or more through-silicon vias (TSVs) extending therethrough to electrically couple devices on a first side of the semiconductor dies to an array of contacts (e.g., bumps, pads) on a second side of the semiconductor dies. A first portion of the TSVs can be used to transmit electrical signals between the first and second sides of the semiconductor dies, and a second portion of the TSVs are used for grounding of the electrical signals.

Figure 1:
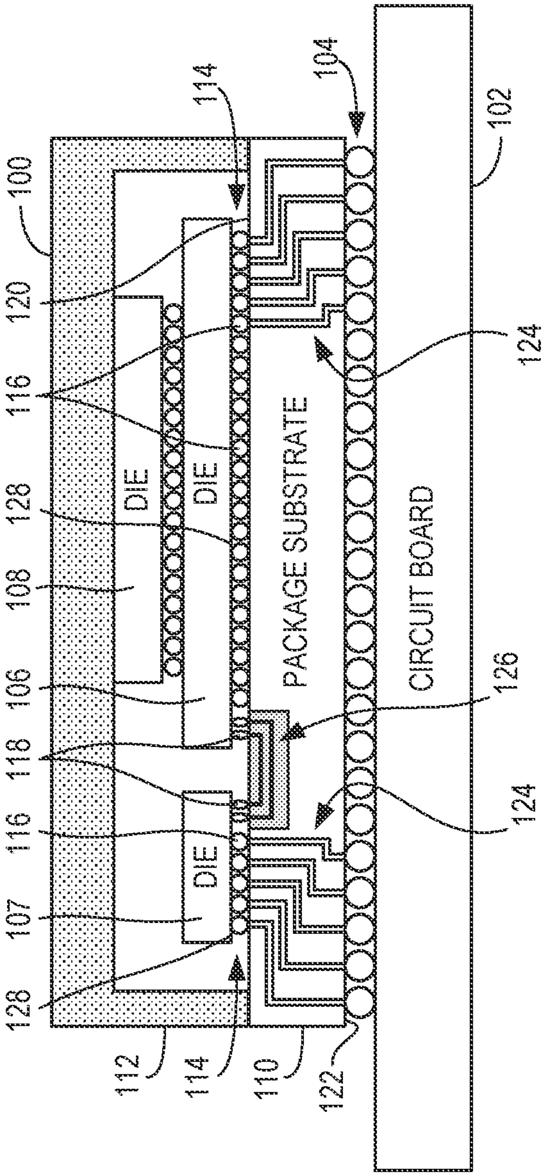
FIG. 1 illustrates an example integrated circuit (IC) package constructed in accordance with teachings of this disclosure.

In general, the same reference numbers will be used throughout the drawing(s) and accompanying written description to refer to the same or like parts. The figures are not to scale. Instead, the thickness of the layers or regions may be enlarged in the drawings. Although the figures show layers and regions with clean lines and boundaries, some or all of these lines and/or boundaries may be idealized. In reality, the boundaries and/or lines may be unobservable, blended, and/or irregular.

As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another.

Notwithstanding the foregoing, in the case of a semiconductor device, "above" is not with reference to Earth, but instead is with reference to a bulk region of a base semiconductor substrate (e.g., a semiconductor wafer) on which components of an integrated circuit are formed. Specifically, as used herein, a first component of an integrated circuit is "above" a second component when the first component is farther away from the bulk region of the semiconductor substrate than the second component.

As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween.

As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name.

As used herein, "approximately" and "about" modify their subjects/values to recognize the potential presence of variations that occur in real world applications. For example, "approximately" and "about" may modify dimensions that may not be exact due to manufacturing tolerances and/or other real world imperfections as will be understood by persons of ordinary skill in the art. For example, "approximately" and "about" may indicate such dimensions may be within a tolerance range of +/−10% unless otherwise specified in the below description. As used herein "substantially real time" refers to occurrence in a near instantaneous manner recognizing there may be real world delays for computing time, transmission, etc. Thus, unless otherwise specified, "substantially real time" refers to real time+/−1 second.

DETAILED DESCRIPTION

In some integrated circuit (IC) packages, a base die (e.g., a semiconductor die, a silicon die) is mechanically and/or electrically coupled between a top die (e.g., a separate semiconductor die, a silicon die) and a substrate, including but not limited to another die, a package, or a printed circuit board (PCB). For instance, the base die may include a first array of contacts (e.g., bumps and/or pads) on a first surface of the base die to mechanically and/or electrically couple to the top die, and a second array of contacts on a second surface of the base die to mechanically and/or electrically couple to the PCB. In some cases, the base die includes one or more vias (e.g., through-silicon vias (TSVs)) extending between the first and second sides of the base die to form electrical paths between the first array of contacts and the second array of contacts. For instance, electrical signals can pass between the top die and the PCB through the vias. In some cases, a first portion of the vias are used for signal routing between the top die and the PCB, while a second portion of the vias are used for providing power to one or more components of the base die and/or the top die. Further, a third portion of the vias can be designated as ground vias to provide a return path for the electrical signals to the ground.

A need for increased connectivity and input/output speeds of IC packages continues to motivate efforts directed to increasing the number of vias that can be implemented in the base die. In some cases, by increasing the number of vias, speed and/or bandwidth of information travel through the vias can be increased. In some cases, increasing the number of vias that can be fabricated in a base die depends on increasing a surface area (e.g., an input/output (I/O) area) of the base die and/or reducing a pitch (e.g., a bump-to-bump pitch) of the vias. However, increasing the surface area of the base die increases manufacturing and/or parts costs associated with the IC package. Further, increasing surface area of the base die increases the lengths of traces to be implemented in the base die, thus reducing efficiency of power and/or signal transmission through the traces. Alternatively, the number of vias fabricated in the base die can be increased by reducing the pitch of the vias. However, reducing the pitch may result in increased crosstalk between the vias, thus reducing quality of signals passing therethrough. Typically, to reduce pitch of the vias while reducing crosstalk, additional ones of the vias may be designated as ground vias (e.g., instead of signal routing vias). However, increasing a proportion of the vias designated as ground vias reduces the bandwidth of information travel through the vias.

Examples disclosed herein reduce crosstalk between vias while improving signaling bandwidth of the vias. In particular, examples disclosed herein provide example grounding members (e.g., grounding structures) in an example semiconductor substrate of an example base die. In some examples, first example grounding members extend from an example metal interconnect proximate a first side of the semiconductor substrate to a first distal point in the semiconductor substrate. Further, second example grounding members extend from a metal contact proximate a second side of the semiconductor substrate to a second distal point in the semiconductor substrate, where the first distal point is closer to the first side of the semiconductor substrate than the second distal point is to the first side of the semiconductor substrate. In some examples, the grounding members are electrically coupled to one or more vias (e.g., TSVs) in the base die. In some examples, the grounding members provide additional ground return paths for signals travelling through signal routing vias in the semiconductor substrate (e.g., in addition to return paths provided by the ground vias in the semiconductor substrate), thus preventing and/or reducing crosstalk between the signal routing vias. Advantageously, by reducing crosstalk between vias, examples disclosed herein enable a reduction in pitch and/or spacing between the vias and, thus, increase the number of vias that can be implemented in the base die. As a result, examples disclosed herein improve a speed and/or bandwidth of information travel through the base die.

FIG. 1 illustrates an example integrated circuit (IC) package 100 that is electrically coupled to a circuit board 102 via an array of bumps or balls 104. In some examples, the IC package 100 may include pins and/or pads, in addition to or instead of the balls 104, to enable the electrical coupling of the package 100 to the circuit board 102. In this example, the package 100 includes three semiconductor (e.g., silicon) dies 106, 107, 108. The first and second semiconductor dies 106, 107 are mounted to a substrate (e.g., a package substrate) 110, and the third semiconductor die (e.g., top die) 108 is mounted and/or otherwise coupled to the first semiconductor die (e.g., base die) 106. In this example, the dies 106, 107, 108 are enclosed by a package lid or mold compound 112. While the example IC package 100 of FIG. 1 includes three dies 106, 107, 108, in other examples, the package 100 may have only one die, only two dies, or more than three dies.

As shown in the illustrated example, each of the first and second dies 106, 107 is electrically and mechanically coupled to the substrate 110 via corresponding arrays of interconnects 114. The electrical connections between the dies 106, 107 and the substrate 110 (e.g., the interconnects 114) are sometimes referred to as first level interconnects. By contrast, the electrical connections between the IC package 100 and the circuit board 102 (e.g., the balls 104) are sometimes referred to as second level interconnects. In some examples, one or more of the dies 106, 107, 108 may be stacked on top of one or more other dies. For example, the third die 108 is coupled to the underlying first die 106 through a first set of first level interconnects and the underlying first die 106 is be connected to the package substrate 110 via a separate set of first level interconnects associated with the underlying first die 106. Thus, as used herein, first level interconnects are formed from the mating and bonding of contacts (e.g., bumps and/or pads) between a die and a package substrate or a die and a separate, underlying die.

As shown in FIG. 1, the interconnects 114 of the first level interconnects include two different types of bumps corresponding to core bumps 116 and bridge bumps 118. As used herein, core bumps 116 refer to bumps on the first and second dies 106, 107 through which electrical signals pass between the first and second dies 106, 107 and components external to the IC package 100. Thus, as shown in the illustrated example, the core bumps 116 physically connected to the inner surface 120 of the substrate 110 are electrically coupled to the balls 104 on the external surface 122 of the substrate 110 via traces 124. As used herein, bridge bumps 118 refer to bumps on the first and second dies 106, 107 through which electrical signals pass between different ones of the first and second dies 106, 107. Thus, as shown in the illustrated example, the bridge bumps 118 of the first die 106 are electrically coupled to the bridge bumps 118 of the second die 107 via an interconnect bridge or interposer 126 embedded in the substrate 110. As represented in FIG. 1, core bumps 116 are typically larger than bridge bumps 118. In examples disclosed herein, the interconnects 114 include copper.

Figure 7A:
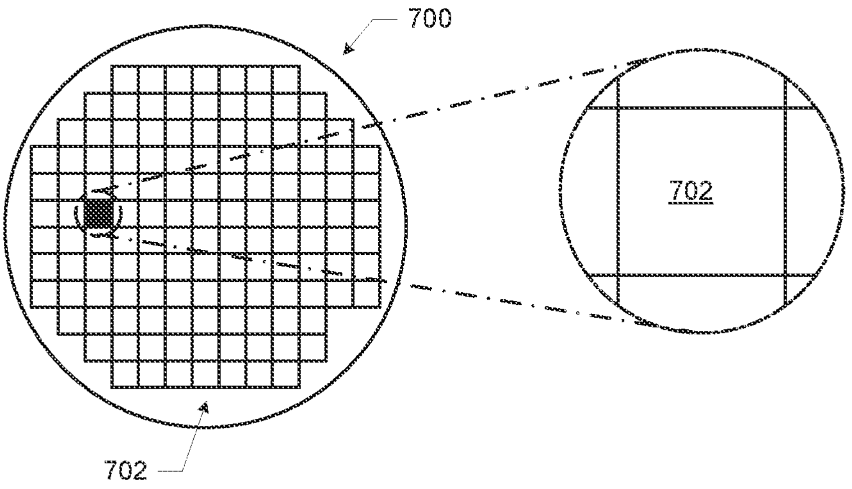
FIG. 7A is a top view of a wafer and dies that may be included in an IC package constructed in accordance with teachings disclosed herein.
Figure 7B:
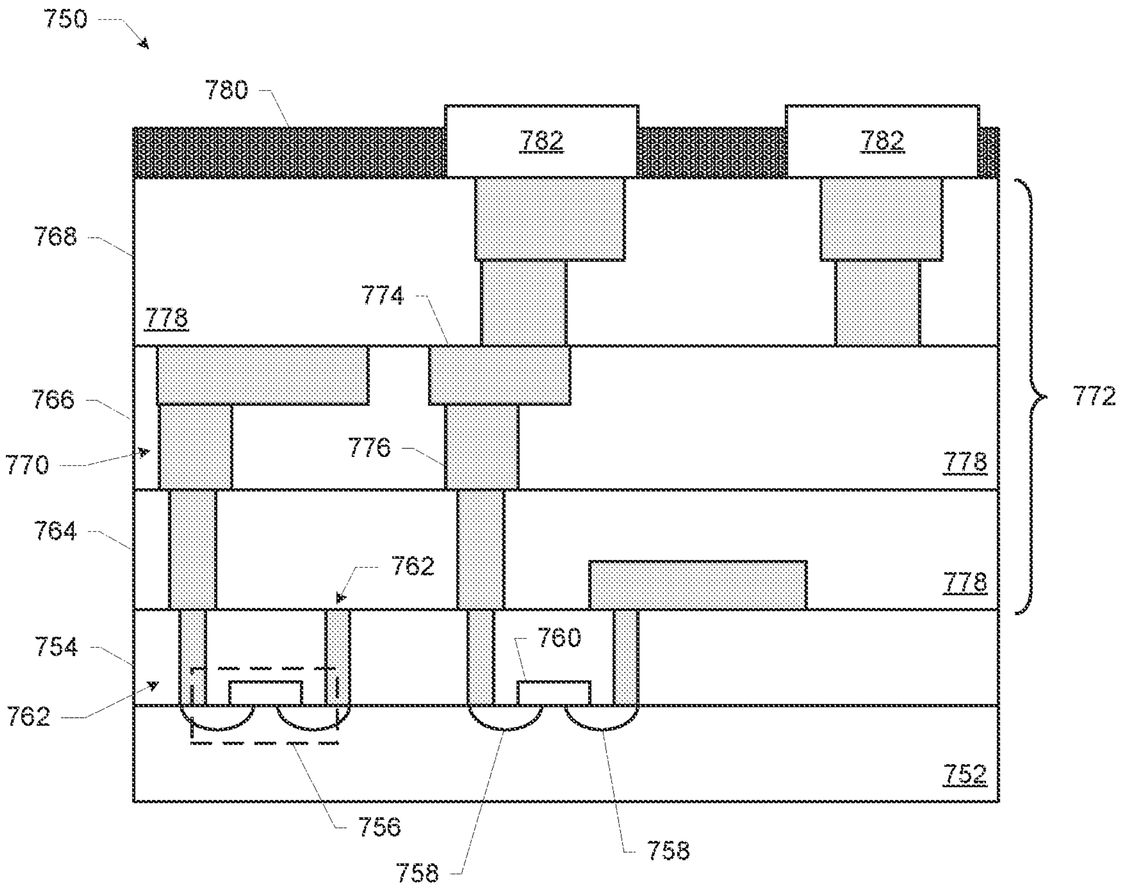
FIG. 7B is a cross-sectional side view of an IC device that may be included in an IC package constructed in accordance with teachings disclosed herein.
Figure 8:
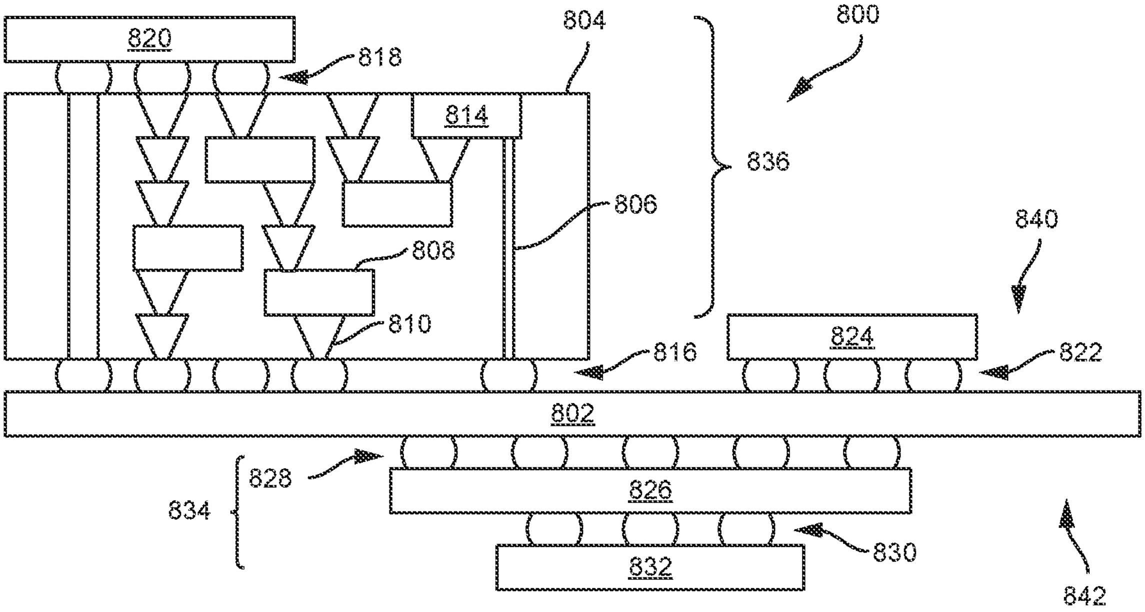
FIG. 8 is a cross-sectional side view of an IC device assembly that may include an IC package constructed in accordance with teachings disclosed herein.

The example IC package 100 disclosed herein may be included in any suitable electronic component. FIGS. 7A, 7B, 8, and/or 9 illustrate various examples of apparatus that may include or be included in the IC package 100 disclosed herein.

Figure 2:
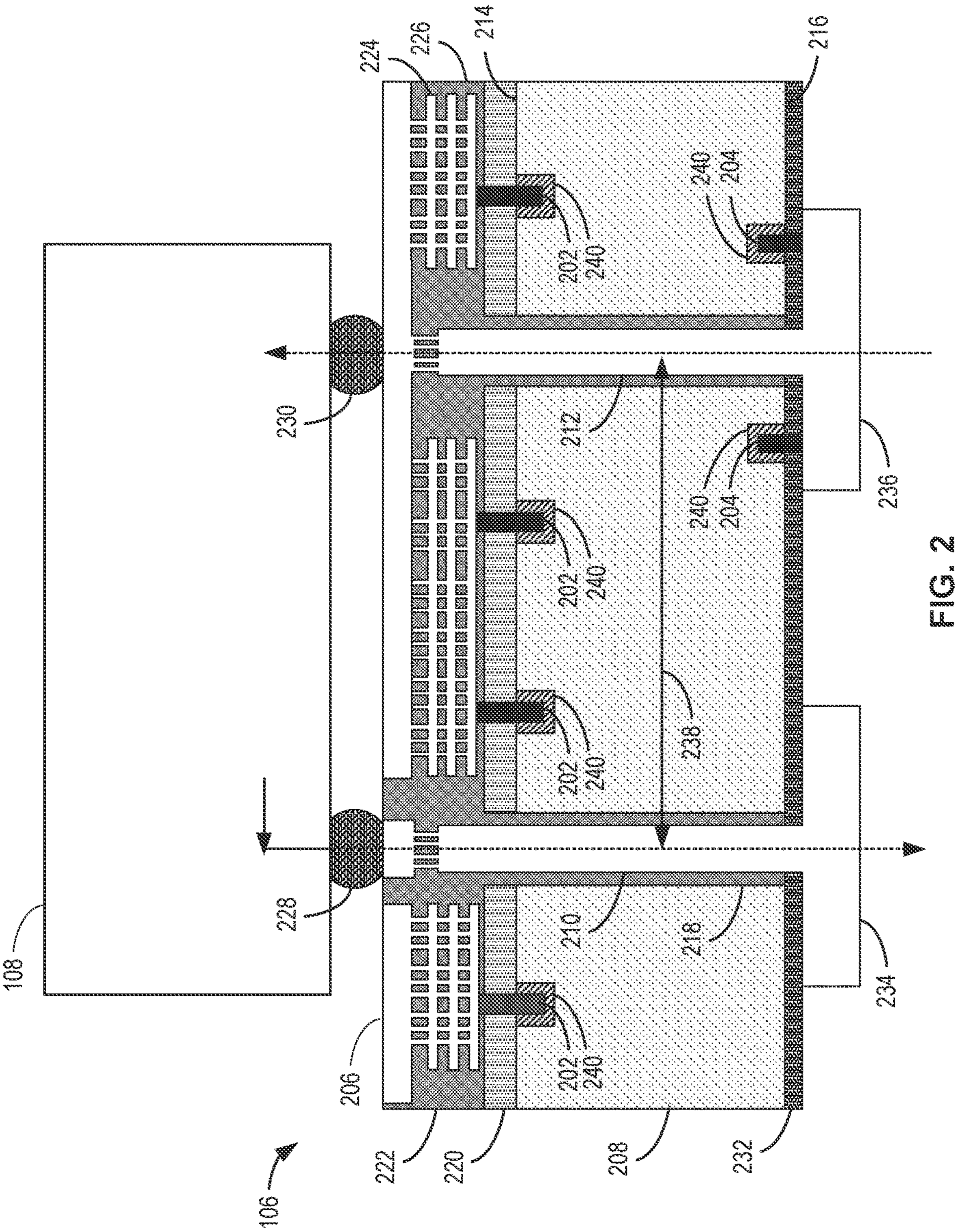
FIG. 2 illustrates example grounding members and example barrier metal implemented in the example base die of FIG. 1 in accordance with teachings of this disclosure.

FIG. 2 illustrates the example semiconductor die (e.g., the first die, a base die, an underlying die) 106 of the example IC package 100 of FIG. 1 implementing example grounding members 202, 204 in accordance with teachings of this disclosure. In this example, the third die 108 of FIG. 1 is coupled to a top surface 206 of the semiconductor die 200. In some examples, additionally or alternatively, the second die 107 of FIG. 1 can be coupled to the top surface 206 of the semiconductor die 200 or to the third die 108.

In the illustrated example of FIG. 1, the semiconductor die 106 includes an example semiconductor substrate (e.g., a substrate layer, a bulk semiconductor region) 208 with first and second example vias (e.g., first and second through-silicon vias (TSVs)) 210, 212 extending between a first example side (e.g., a top side, a front side) 214 and a second example side (e.g., a bottom side, a back side) 216 of the semiconductor substrate 208. In this example, the semiconductor substrate 208 includes silicon, and the vias 210, 212 include a conductive material (e.g., copper). In this example, an example insulating layer (e.g., an oxide layer) 218 surrounds and/or encases the vias 210, 212 in the semiconductor substrate 208 to provide electrical isolation between the vias 210, 212 and the semiconductor substrate 208, and to prevent and/or reduce diffusion of conductive material from the vias 210, 212 to the silicon material in the semiconductor substrate 208.

In the illustrated example, an example device layer 220 is coupled to (e.g., deposited on) the first side 214 of the semiconductor substrate 208. In some examples, the device layer 220 includes one or more devices (e.g., transistors) in an insulating material. Further, an example routing layer 222 is coupled to (e.g., deposited on) the device layer 220 adjacent to the first side 214 of the semiconductor substrate 208. In some examples, the routing layer 222 includes example metal interconnects (e.g., conductive traces, conductive paths) 224 formed in an example insulating material 226. In some examples, the insulating material 226 of the routing layer 222 is the same as the insulating material used for the insulating layer 218 and/or the device layer 220. In some examples, the metal interconnects 224 include cross-linking paths (e.g., cross-metal signal links) that extend in X and Y directions of a plane of the routing layer 222 to electrically couple different locations of the routing layer 222 (e.g., to deliver electrical signals to select ones of the devices in the device layer 220). Additionally or alternatively, the metal interconnects 224 can include one or more internal contact paths to couple locations internal to the routing layer 222, one or more power metal mesh layers through which power can be supplied to one or more devices in the device layer 220, and/or one or more grounding interconnects. In the example of FIG. 2, example interconnects 228, 230 are coupled between the routing layer 222 and the third die 108. In particular, the interconnects 228, 230 are mechanically and/or electrically coupled to respective ones of the vias 210, 212.

In the illustrated example of FIG. 2, an example isolation layer 232 is coupled to (e.g., deposited on) the second side 216 of the semiconductor substrate 208. In some examples, the isolation layer 232 includes an insulating material. In some examples, the isolation layer 232 can include a metal layer (e.g., a copper layer) embedded therein. In the illustrated example, example contacts (e.g., bumps, pins, and/or pads) 234, 236 are provided on the isolation layer 232 and mechanically and/or electrically coupled to respective ones of the vias 210, 212. In some examples, the contacts 234, 236 include layers of conductive material (e.g., copper) deposited on the second side 216. In some examples, the contacts 234, 236 can be coupled (e.g., mechanically and/or electrically coupled) to corresponding contact surfaces on the package substrate 110 of FIG. 1 and/or a separate die.

In the illustrated example of FIG. 2, electrical signals can travel to and/or from the third die 108 through the vias 210, 212. In this example, the first via 210 is a signal routing via through which the third die 108 can transmit electrical signals to the package substrate 110 of FIG. 1, a PCB, and/or a separate die coupled to the first contact 234 of the semiconductor die 106. Further, the second via 212 is a ground via that provides a return path for the electrical signals to a ground. While two of the vias 210, 212 are shown in FIG. 2, the semiconductor die 106 can include one or more additional signal routing vias, ground vias, and/or power vias.

In this example, an example pitch (e.g., bump-to-bump pitch) 238 of the vias 210, 212 corresponds to a distance (e.g., a horizontal distance) between a center of the first via 210 and a center of the second via 212. In some examples, the pitch 238 may be reduced to allow additional vias to be provided in the semiconductor die 106. However, reducing the pitch 238 between adjacent routing vias may increase crosstalk between the routing vias, thus reducing signal quality through the routing vias.

In the illustrated example of FIG. 2, to reduce crosstalk between adjacent routing vias, the semiconductor die 106 includes the grounding members (e.g., grounding structures) 202, 204 adjacent the first and second sides 214, 216 of the semiconductor substrate 208, respectively. In the illustrated example of FIG. 2, the first grounding members 202 extend between a first distal point in the semiconductor substrate 208 and at least one grounding interconnect of the metal interconnects 224 in the routing layer 222. Further, the second grounding members 204 extend between a second distal point in the semiconductor substrate 208 and the second contact (e.g., the ground bump) 236. In this example, the first distal point is closer to the first side 214 of the semiconductor substrate 208 than the second distal point is to the first side 214 of the semiconductor substrate 208. In particular, the first distal point is proximate the first side 214 of the semiconductor substrate 208, and the second distal point is proximate the second side 216 of the semiconductor substrate 208. In the illustrated example, the first grounding members 202 extend through the device layer 220, and the second grounding members extend through the isolation layer 232.

In this example, the grounding members 202, 204 are made of a conductive material (e.g., copper). In some examples, the grounding members 202, 204 include pillars (e.g., cylinders) having a circular cross-section, a rectangular cross-section, etc. Additionally or alternatively, the grounding members 202 can include trenches that extend in at least one of an X direction or a Y direction along the first and second sides 214, 216 of the semiconductor substrate 208. In some examples, a dimension (e.g., a width) of the grounding members 202, 204 is between 0.7 microns (e.g., micrometers (μm)) and 1.2 microns. However, a different dimension (e.g., less than 0.7 microns or more than 1.2 microns) may be used instead. Furthermore, in some examples, the grounding members 202, 204 extend into the semiconductor substrate 208 by at least 0.5 microns. In some such examples, the grounding members 202, 204 extend into the semiconductor substrate 208 up to 1 micron.

In some examples, during production of the semiconductor substrate 208, the grounding members 202, 204 are provided at least partially within the semiconductor substrate 208. For example, conductive material (e.g., metal, copper) is deposited with layers of silicon material to fabricate the semiconductor substrate 208 with the grounding members 202, 204. Additionally or alternatively, the grounding members 202, 204 can be formed by forming apertures in the silicon material of the semiconductor substrate 208 and providing the conductive material in the apertures. In some examples, the conductive material can be formed in a desired shape (e.g., pillars and/or trenches) prior to providing the conductive material in the apertures. In some examples, the conductive material is deposited in layers in the apertures to form the grounding members 202, 204.

In this example, the grounding members 202, 204 are electrically coupled to the vias 212. More particularly, a portion of the grounding members 202, 204 that extends into the semiconductor substrate 208 is not electrically isolated from the semiconductor substrate 208. In some examples, the grounding members 202, 204 are used to ground the semiconductor substrate 208 at the first and second sides 214, 216 such that the semiconductor substrate 208 provides an additional return path to the ground (e.g., in addition to the second via 212). In such examples, the additional return path helps to isolate the electrical signal(s) passing through routing vias (e.g., the first via 210), thus reducing crosstalk between adjacent ones of the routing vias. Further, the reduction in crosstalk allows the routing vias to be placed closer together (e.g., at a reduced pitch) in the semiconductor substrate 208, thus increasing bandwidth and/or speed of information travel through the semiconductor die 106. In some examples, by implementing the grounding members 202, 204 in the semiconductor die 106 as shown in FIG. 2, a speed of information travel (e.g., in Gigabytes per second (Gb/s)) through the semiconductor die 106 can be increased between 14% to 17% compared to the semiconductor die 106 not implementing the grounding members 202, 204.

In the illustrated example, four of the first grounding members 202 are implemented at the first side 214 of the semiconductor substrate 208, and two of the second grounding members 204 are implemented at the second side 216 of the semiconductor substrate 208. In some examples, a different number of the first grounding members 202 and/or the second grounding members 204 may be used instead. In some examples, a number of the first grounding members 202 is greater than a number of the second grounding members 204. For example, because the second grounding members 204 are to be coupled to ground contacts (e.g., the second contact 236), an available surface area of the second side 216 for implementing the second grounding members 204 corresponds to an area above the second contact 236. However, an available surface area of the first side 214 for implementing the first grounding members 202 is greater than the available surface area of the second side 216, such that that a greater number of the first grounding members 202 may be implemented at the first side 214 compared to the number of the second grounding members 204 implemented at the second side 216. In some examples, at least one of the first grounding members 202 and at least one of the second grounding members 204 is implemented between each pair of adjacent vias (e.g., the vias 210, 212). In some examples, the number of the grounding members 202, 204 is greater than (e.g., approximately 1.5 times) the number of the vias 210, 212 in the semiconductor die 106.

In some examples, diffusion of copper from the grounding members 202, 204 to the semiconductor substrate 208 may occur when the grounding members 202, 204 are in direct contact with silicon material of the semiconductor substrate 208. Thus, in the illustrated example of FIG. 2, regions of example barrier metal 240 are provided in the semiconductor substrate 208 proximate the first and second sides 214, 216 to provide a barrier between the grounding members 202, 204 and the semiconductor substrate 208. In some examples, layers of the barrier metal 240 are deposited during formation of the semiconductor substrate 208, and the grounding members 202, 204 are provided in the barrier metal 240 such that portions of the grounding members 202, 204 in the semiconductor substrate 208 are embedded in and/or enveloped by the barrier metal 240. In some examples, the barrier metal 240 includes at least one of titanium or tantalum. However, a different metal for the barrier metal 240 may be used instead.

Figure 3:
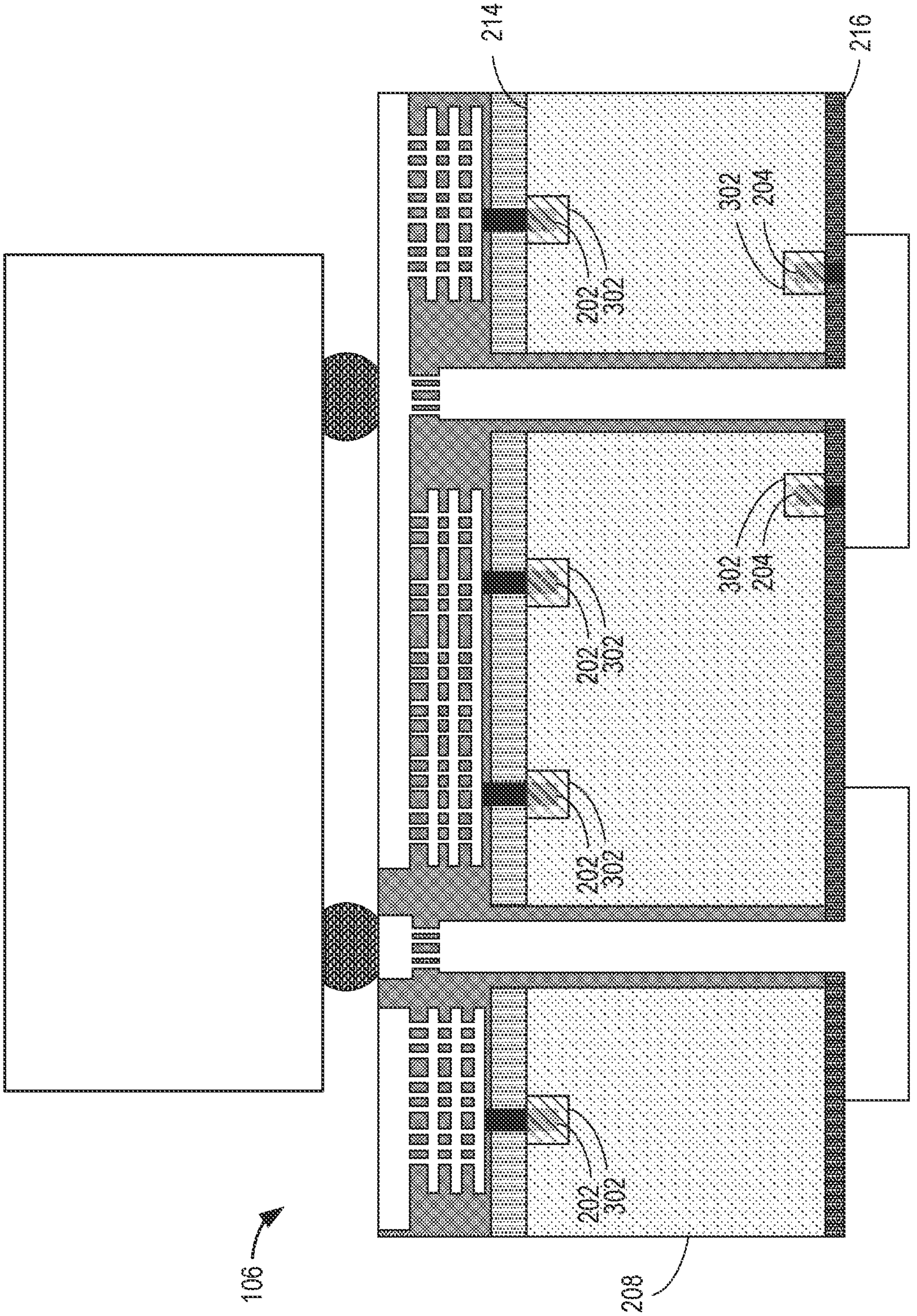
FIG. 3 illustrates the example grounding members and example doping regions implemented in the example base die of FIG. 1 in accordance with teachings of this disclosure.

FIG. 3 illustrates the example semiconductor die 106 of FIG. 2 implementing the grounding members 202, 204 and example doped regions 302. For example, in the illustrated example of FIG. 3, the example doped regions 302 are provided in the semiconductor substrate 208 in addition to or instead of the barrier metal 240 of FIG. 2. In some examples, the doped regions 302 are produced by ion implantation during and/or after production of the semiconductor substrate 208. In particular, ions are accelerated toward and/or penetrate the sides 214, 216 of the semiconductor substrate 208 to form the doped regions 302. In this example, the grounding members 202, 204 are embedded in and/or enveloped by the doped regions 302 in the semiconductor substrate 208. In some examples, the doped regions 302 block and/or restrict direct current (DC) while allowing alternating current (AC) coupling to the grounding members 202, 204.

Figure 4:
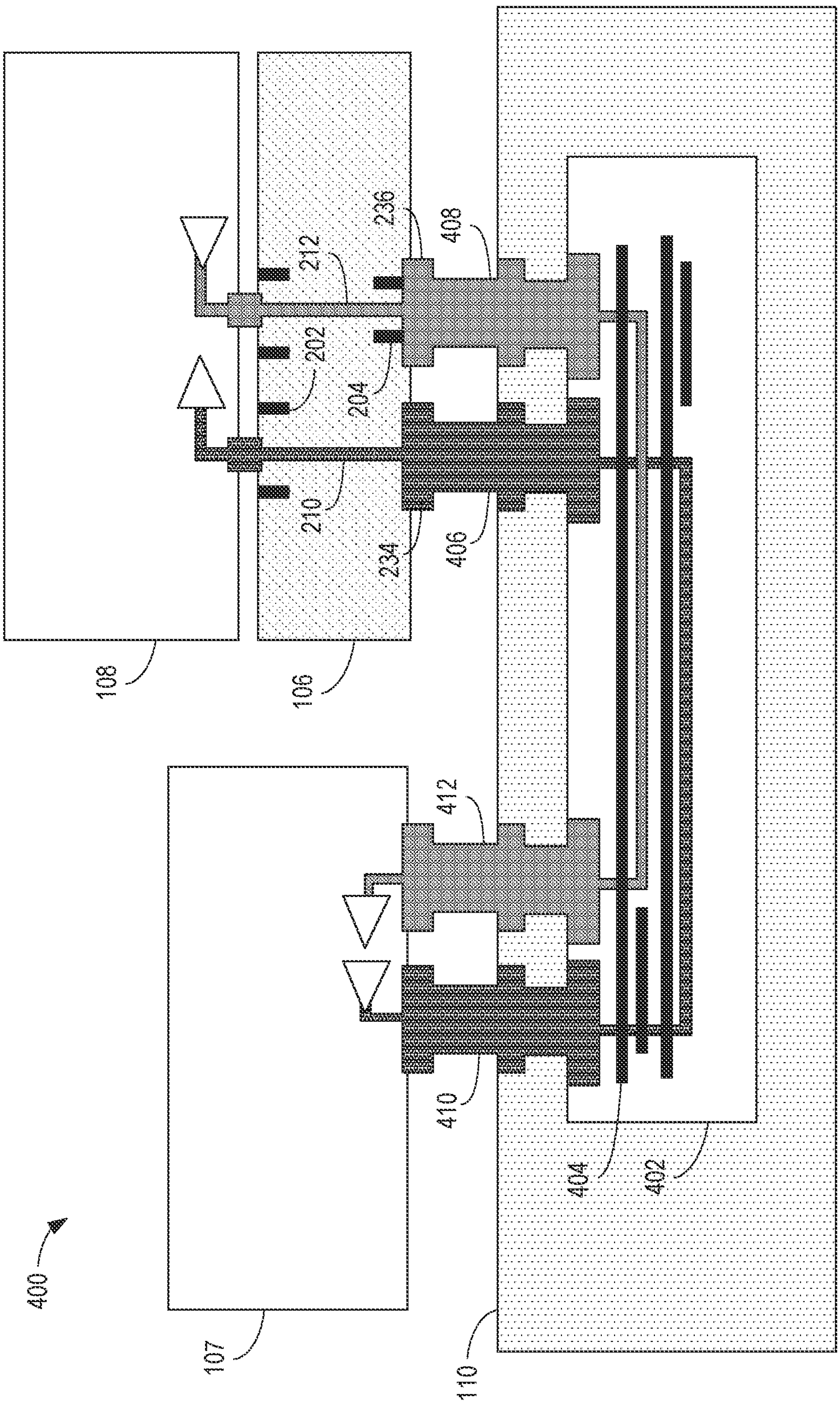
FIG. 4 illustrates a second example IC package that may implement the example base die of FIGS. 2 and/or 3.

FIG. 4 illustrates a second example integrated circuit (IC) package 400 in which the example semiconductor die 106 including the example grounding members 202, 204 of FIGS. 2 and/or 3 can be implemented. In the illustrated example of FIG. 4, the third die 108 is coupled to the semiconductor die 106, and the semiconductor die 106 is further coupled (e.g., electrically and/or mechanically coupled) to the package substrate 110. In this example, the package substrate 110 includes an example bridge 402 including example traces (e.g., conductive paths) 404. In this example, the traces 404 electrically couple first example interconnects 406, 408 to respective ones of second example interconnects 410, 412, where the first interconnects 406, 408 couple the semiconductor die 106 to the package substrate 110 and the second interconnects 410, 412 couple the second die 107 to the package substrate 110. For example, the first interconnects 406, 408 are coupled to respective ones of the contacts 234, 236 and, thus, are further coupled to the vias 210, 212 of the semiconductor die 106.

In this example, the grounding members 202, 204 are implemented in the semiconductor die 106 (e.g., as described in connection with FIGS. 2 and/or 3 above). In some examples, additional ones of the grounding members 202, 204 can be used in one or more locations of the IC package 400. For example, additional ones of the grounding members 202, 204 can be implemented in the package substrate 110 and/or the bridge 402. In some examples, the IC package 400 can include one or more additional ones of the semiconductor die 106 coupled between the package substrate 110 and the third die 108 and/or between the package substrate 110 and the second die 107. In such examples, additional ones of the grounding members 202, 204 can be implemented in the additional one(s) of the semiconductor die 106.

Figure 5:
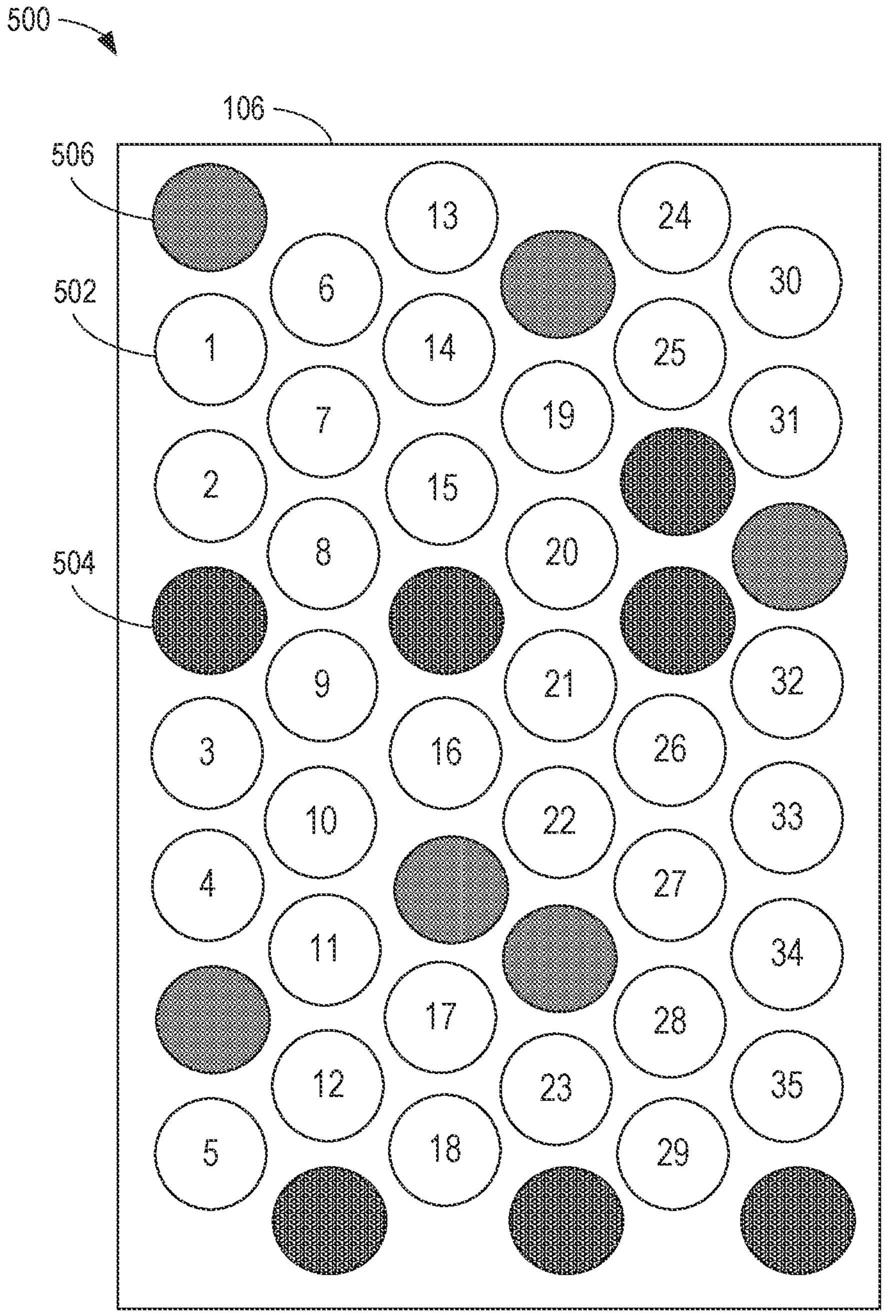
FIG. 5 illustrates an example bump pattern that can be implemented on the example base die of FIGS. 2 and/or 3.

FIG. 5 illustrates a top view of the semiconductor die 106 of FIGS. 2, 3, and/or 4 including an example bump pattern 500 that may be implemented in examples disclosed herein. In the illustrated example of FIG. 5, the bump pattern 500 includes first example bumps 502 (e.g., numbered 1 through 35 in FIG. 5) corresponding to signal routing bumps, second example bumps 504 corresponding to power bumps, and third example bumps 506 corresponding to ground bumps. In this example, each of the bumps 502, 504, 506 is coupled to a respective via (e.g., including the vias 210, 212 of FIGS. 2, 3, and/or 4) in the semiconductor die 106. For example, the first bumps 502 and first corresponding vias enable routing of signals to and/or from the third die 108 of FIGS. 1, 2 and/or 3. Further, the second bumps 504 and second corresponding vias are used to provide power to the third die 108, and the third bumps 506 and third corresponding vias are used to ground the signals travelling through the semiconductor die 106. In some examples, one or more of the grounding members 202, 204 of FIGS. 2, 3, and/or 4 are implemented between adjacent ones of the bumps 502, 504, 506 to reduce crosstalk therebetween.

Figure 6:
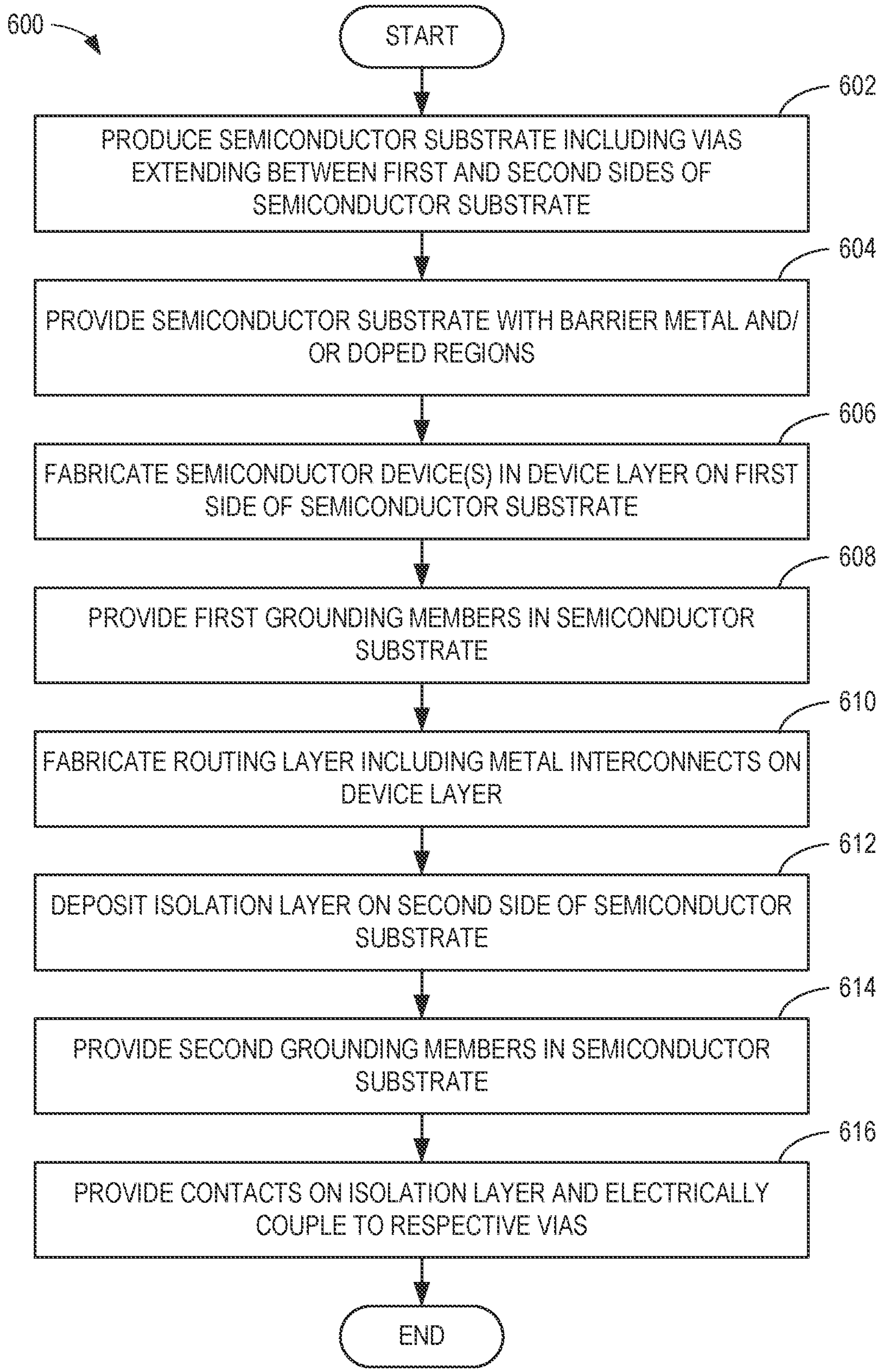
FIG. 6 is a flowchart representative of an example method of manufacturing the example base die of FIGS. 2 and/or 3.

FIG. 6 is a flowchart representative of an example method 600 of manufacturing the example semiconductor die 106 of FIGS. 2 and/or 3. In some examples, some or all of the operations outlined in the example method 600 are performed automatically by fabrication equipment that is programmed to perform the operations. Although the example method of manufacturing is described with reference to the flowchart illustrated in FIG. 6, many other methods may alternatively be used. For example, the order of execution of the blocks may be changed, and/or some of the blocks described may be combined, divided, re-arranged, omitted, eliminated, and/or implemented in any other way.

The example method 600 of FIG. 6 begins at block 602 by producing the example semiconductor substrate 208 of FIGS. 2 and/or 3 including the vias 210, 212 extending between the first and second sides 214, 216 of the semiconductor substrate 208. For example, the semiconductor substrate 208 is fabricated by depositing layers of silicon with conductive material (e.g., metal, copper) to form the vias 210, 212.

At block 604, the example method 600 includes providing the semiconductor substrate 208 with the example barrier metal 240 of FIG. 2 and/or the example doped regions 302 of FIG. 3. For example, the barrier metal 240 is provided to the semiconductor substrate 208 during fabrication of the semiconductor substrate 208 by depositing metal material (e.g., titanium and/or tantalum) with the layers of silicon and/or conductive material proximate the first and second sides 214, 216 of the semiconductor substrate 208. Additionally or alternatively, the doped regions 302 are provided to the semiconductor substrate 208 by ion implantation.

At block 606, the example method 600 includes fabricating one or more semiconductor devices (e.g., transistors) in the example device layer 220 of FIG. 2 on the first side 214 of the semiconductor substrate 208. For example, the device layer 220 is formed by fabricating the semiconductor device(s) on the first side 214 of the semiconductor substrate 208, then enveloping and/or surrounding the device(s) in an insulating material.

At block 608, the example method 600 includes providing the first example grounding members 202 of FIGS. 2, 3, and/or 4 in the semiconductor substrate 208. For example, the first grounding members 202 are provided during fabrication of the semiconductor substrate 208 by depositing layers of conductive material (e.g., metal, copper) with the silicon material and/or the barrier metal 240 proximate the first side 214 of the semiconductor substrate 208, and further depositing conductive material on the first side 214 such that the first grounding members 202 protrude from the semiconductor substrate 208. In some examples, the first grounding members 202 are provided after fabrication of the semiconductor substrate 208. For example, apertures can be provided in the barrier metal 240 and/or the doped regions 302 in the semiconductor substrate 208, and conductive material is deposited in the apertures to form the first grounding members 202.

At block 610, the example method 600 includes fabricating the example routing layer 222 of FIG. 2 including the example metal interconnects 224 of FIG. 2 on the example device layer 220. For example, layers of the insulating material 226 are deposited on the device layer 220 with conductive material (e.g., metal, copper) to form the metal interconnects 224 in the routing layer 222. In some examples, one or more of the metal interconnects 224 are grounding interconnects that are electrically coupled to the first grounding members 202.

At block 612, the example method 600 includes depositing the example isolation layer 232 of FIG. 2 on the example second side 216 of the semiconductor substrate 208. For example, layers of insulating material are deposited on the second side 216 to form the isolation layer 232. In some examples, one or more layers of conductive material (e.g., metal, copper) can be deposited in between the layers of insulating material to form an example metal layer within the isolation layer 232.

At block 614, the example method 600 includes providing the second example grounding members 204 in the semiconductor substrate 208. For example, the second grounding members 204 are provided during fabrication of the semiconductor substrate 208 by depositing layers of conductive material (e.g., metal, copper) with the silicon material and/or the barrier metal 240 proximate the second side 216 of the semiconductor substrate 208, and further depositing the conductive material on the second side 216 such that the second grounding members 204 protrude from the semiconductor substrate 208. In some examples, apertures are provided in the barrier metal 240 and/or the doped regions 302 proximate the second side 216 of the semiconductor substrate 208, and conductive material is provided in the apertures to form the second grounding members 204.

At block 616, the example method 600 includes providing the example contacts 234, 236 of FIGS. 2 and/or 4 on the isolation layer 232 and electrically couple the contacts 234, 236 to the respective vias 210, 212. For example, conductive material (e.g., metal, copper) is deposited on the isolation layer 232 to form the contacts 234, 236. In some examples, the first contact 234 is electrically coupled to the first via 210, and the second contact 236 is electrically coupled to the second via 212. Further, the second contact 236 is electrically coupled to one or more of the second grounding members 204.

FIG. 7A is a top view of a wafer 700 and dies 702 that may be included in the IC package 100 of FIG. 1 and/or the IC package 400 of FIG. 4 (e.g., as any suitable ones of the first die 106, the second die 107, or the third die 108). The wafer 700 may be composed of semiconductor material and may include one or more dies 702 having IC structures formed on a surface of the wafer 700. Each of the dies 702 may be a repeating unit of a semiconductor product that includes any suitable IC. After the fabrication of the semiconductor product is complete, the wafer 700 may undergo a singulation process in which the dies 702 are separated from one another to provide discrete "chips" of the semiconductor product. The die 702 may include one or more transistors (e.g., some of the transistors 756 of FIG. 7B, discussed below), supporting circuitry to route electrical signals to the transistors, passive components (e.g., signal traces, resistors, capacitors, or inductors), and/or any other IC components. In some examples, the wafer 700 or the die 702 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 702. For example, a memory array formed by multiple memory devices may be formed on a same die 702 as processor circuitry (e.g., the processor circuitry 902 of FIG. 9) or other logic that is configured to store information in the memory devices or execute instructions stored in the memory array. The example IC package 100 of FIG. 1 and/or the IC package 400 of FIG. 4 disclosed herein may be manufactured using a die-to-wafer assembly technique in which some dies 106, 107, 108 are attached to a wafer 700 that include others of the dies 106, 107, 108, and the wafer 700 is subsequently singulated.

FIG. 7B is a cross-sectional side view of an IC device 750 that may be included in the example IC package 100 of FIG. 1 and/or the example IC package 400 of FIG. 4 (e.g., in any one of the dies 106, 107, 108). One or more of the IC devices 750 may be included in one or more dies 702 (FIG. 7A). The IC device 750 may be formed on a die substrate 752 (e.g., the wafer 700 of FIG. 7A) and may be included in a die (e.g., the die 702 of FIG. 7A). The die substrate 752 may be a semiconductor substrate composed of semiconductor material systems including, for example, n-type or p-type materials systems (or a combination of both). The die substrate 752 may include, for example, a crystalline substrate formed using a bulk silicon or a silicon-on-insulator (SOI) substructure. In some examples, the die substrate 752 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the die substrate 752. Although a few examples of materials from which the die substrate 752 may be formed are described here, any material that may serve as a foundation for an IC device 750 may be used. The die substrate 752 may be part of a singulated die (e.g., the dies 702 of FIG. 7A) or a wafer (e.g., the wafer 700 of FIG. 7A).

The IC device 750 may include one or more device layers 754 disposed on the die substrate 752. The device layer 754 may include features of one or more transistors 756 (e.g., metal oxide semiconductor field-effect transistors (MOSFETs)) formed on the die substrate 752. The device layer 754 may include, for example, one or more source and/or drain (S/D) regions 758, a gate 760 to control current flow in the transistors 756 between the S/D regions 758, and one or more S/D contacts 762 to route electrical signals to/from the S/D regions 758. The transistors 756 may include additional features not depicted for the sake of clarity, such as device isolation regions, gate contacts, and the like. The transistors 756 are not limited to the type and configuration depicted in FIG. 7B and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 756 may include a gate 760 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some examples, an annealing process may be carried out on the gate dielectric to improve its quality when a high-k material is used.

The gate electrode may be formed on the gate dielectric and may include at least one p-type work function metal or n-type work function metal, depending on whether the transistor 756 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some examples, when viewed as a cross-section of the transistor 756 along the source-channel-drain direction, the gate electrode may consist of a U-shaped structure that includes a bottom portion substantially parallel to the surface of the die substrate 752 and two sidewall portions that are substantially perpendicular to the top surface of the die substrate 752. In other examples, at least one of the metal layers that form the gate electrode may simply be a planar layer that is substantially parallel to the top surface of the die substrate 752 and does not include sidewall portions substantially perpendicular to the top surface of the die substrate 752. In other examples, the gate electrode may consist of a combination of U-shaped structures and planar, non-U-shaped structures. For example, the gate electrode may consist of one or more U-shaped metal layers formed atop one or more planar, non-U-shaped layers.

In some examples, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some examples, a plurality of spacer pairs may be used; for instance, two pairs, three pairs, or four pairs of sidewall spacers may be formed on opposing sides of the gate stack.

The S/D regions 758 may be formed within the die substrate 752 adjacent to the gate 760 of each transistor 756. The S/D regions 758 may be formed using an implantation/diffusion process or an etching/deposition process, for example. In the former process, dopants such as boron, aluminum, antimony, phosphorous, or arsenic may be ion-implanted into the die substrate 752 to form the S/D regions 758. An annealing process that activates the dopants and causes them to diffuse farther into the die substrate 752 may follow the ion-implantation process. In the latter process, the die substrate 752 may first be etched to form recesses at the locations of the S/D regions 758. An epitaxial deposition process may then be carried out to fill the recesses with material that is used to fabricate the S/D regions 758. In some implementations, the S/D regions 758 may be fabricated using a silicon alloy such as silicon germanium or silicon carbide. In some examples, the epitaxially deposited silicon alloy may be doped in situ with dopants such as boron, arsenic, or phosphorous. In some examples, the S/D regions 758 may be formed using one or more alternate semiconductor materials such as germanium or a group III-V material or alloy. In further examples, one or more layers of metal and/or metal alloys may be used to form the S/D regions 758.

Electrical signals, such as power and/or input/output (I/O) signals, may be routed to and/or from the devices (e.g., transistors 756) of the device layer 754 through one or more interconnect layers disposed on the device layer 754 (illustrated in FIG. 7B as interconnect layers 764-768). For example, electrically conductive features of the device layer 754 (e.g., the gate 760 and the S/D contacts 762) may be electrically coupled with the interconnect structures 770 of the interconnect layers 764-768. The one or more interconnect layers 764-768 may form a metallization stack (also referred to as an "ILD stack") 772 of the IC device 750.

The interconnect structures 770 may be arranged within the interconnect layers 764-768 to route electrical signals according to a wide variety of designs (in particular, the arrangement is not limited to the particular configuration of interconnect structures 770 depicted in FIG. 7B). Although a particular number of interconnect layers 764-768 is depicted in FIG. 7B, examples of the present disclosure include IC devices having more or fewer interconnect layers than depicted.

In some examples, the interconnect structures 770 may include lines 774 and/or vias 776 filled with an electrically conductive material such as a metal. The lines 774 may be arranged to route electrical signals in a direction of a plane that is substantially parallel with a surface of the die substrate 752 upon which the device layer 754 is formed. For example, the lines 774 may route electrical signals in a direction in and out of the page from the perspective of FIG. 7B. The vias 776 may be arranged to route electrical signals in a direction of a plane that is substantially perpendicular to the surface of the die substrate 752 upon which the device layer 754 is formed. In some examples, the vias 776 may electrically couple lines 774 of different interconnect layers 764-768 together.

The interconnect layers 764-768 may include a dielectric material 778 disposed between the interconnect structures 770, as shown in FIG. 7B. In some examples, the dielectric material 778 disposed between the interconnect structures 770 in different ones of the interconnect layers 764-768 may have different compositions; in other examples, the composition of the dielectric material 778 between different interconnect layers 764-768 may be the same.

A first interconnect layer 764 (referred to as Metal 1 or "M1") may be formed directly on the device layer 754. In some examples, the first interconnect layer 764 may include lines 774 and/or vias 776, as shown. The lines 774 of the first interconnect layer 764 may be coupled with contacts (e.g., the S/D contacts 762) of the device layer 754.

A second interconnect layer 766 (referred to as Metal 2 or "M2") may be formed directly on the first interconnect layer 764. In some examples, the second interconnect layer 766 may include vias 776 to couple the lines 774 of the second interconnect layer 766 with the lines 774 of the first interconnect layer 764. Although the lines 774 and the vias 776 are structurally delineated with a line within each interconnect layer (e.g., within the second interconnect layer 766) for the sake of clarity, the lines 774 and the vias 776 may be structurally and/or materially contiguous (e.g., simultaneously filled during a dual-damascene process) in some examples.

A third interconnect layer 768 (referred to as Metal 3 or "M3") (and additional interconnect layers, as desired) may be formed in succession on the second interconnect layer 766 according to similar techniques and configurations described in connection with the second interconnect layer 766 or the first interconnect layer 764. In some examples, the interconnect layers that are "higher up" in the metallization stack 772 in the IC device 750 (i.e., further away from the device layer 754) may be thicker.

The IC device 750 may include a solder resist material 780 (e.g., polyimide or similar material) and one or more conductive contacts 782 formed on the interconnect layers 764-768. In FIG. 7B, the conductive contacts 782 are illustrated as taking the form of bond pads. The conductive contacts 782 may be electrically coupled with the interconnect structures 770 and configured to route the electrical signals of the transistor(s) 756 to other external devices. For example, solder bonds may be formed on the one or more conductive contacts 782 to mechanically and/or electrically couple a chip including the IC device 750 with another component (e.g., a circuit board). The IC device 750 may include additional or alternate structures to route the electrical signals from the interconnect layers 764-768; for example, the conductive contacts 782 may include other analogous features (e.g., posts) that route the electrical signals to external components.

FIG. 8 is a cross-sectional side view of an IC device assembly 800 that may include the IC package 100 of FIG. 1 and/or the IC package 400 of FIG. 4 disclosed herein. In some examples, the IC device assembly corresponds to the IC package 100 of FIG. 1 and/or the IC package 400 of FIG. 4. The IC device assembly 800 includes a number of components disposed on a circuit board 802 (which may be, for example, a motherboard). The IC device assembly 800 includes components disposed on a first face 840 of the circuit board 802 and an opposing second face 842 of the circuit board 802; generally, components may be disposed on one or both faces 840 and 842. Any of the IC packages discussed below with reference to the IC device assembly 800 may take the form of the example IC package 100 of FIG. 1 and/or the example IC package 400 of FIG. 4.

In some examples, the circuit board 802 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 802. In other examples, the circuit board 802 may be a non-PCB substrate. In some examples, the circuit board 802 may be, for example, the circuit board 102 of FIG. 1.

The IC device assembly 800 illustrated in FIG. 8 includes a package-on-interposer structure 836 coupled to the first face 840 of the circuit board 802 by coupling components 816. The coupling components 816 may electrically and mechanically couple the package-on-interposer structure 836 to the circuit board 802, and may include solder balls (as shown in FIG. 8), male and female portions of a socket, an adhesive, an underfill material, and/or any other suitable electrical and/or mechanical coupling structure.

The package-on-interposer structure 836 may include an IC package 820 coupled to an interposer 804 by coupling components 818. The coupling components 818 may take any suitable form for the application, such as the forms discussed above with reference to the coupling components 816. Although a single IC package 820 is shown in FIG. 8, multiple IC packages may be coupled to the interposer 804; indeed, additional interposers may be coupled to the interposer 804. The interposer 804 may provide an intervening substrate used to bridge the circuit board 802 and the IC package 820. The IC package 820 may be or include, for example, a die (the die 702 of FIG. 7A), an IC device (e.g., the IC device 750 of FIG. 7B), or any other suitable component. Generally, the interposer 804 may spread a connection to a wider pitch or reroute a connection to a different connection. For example, the interposer 804 may couple the IC package 820 (e.g., a die) to a set of BGA conductive contacts of the coupling components 816 for coupling to the circuit board 802. In the example illustrated in FIG. 8, the IC package 820 and the circuit board 802 are attached to opposing sides of the interposer 804; in other examples, the IC package 820 and the circuit board 802 may be attached to a same side of the interposer 804. In some examples, three or more components may be interconnected by way of the interposer 804.

In some examples, the interposer 804 may be formed as a PCB, including multiple metal layers separated from one another by layers of dielectric material and interconnected by electrically conductive vias. In some examples, the interposer 804 may be formed of an epoxy resin, a fiberglass-reinforced epoxy resin, an epoxy resin with inorganic fillers, a ceramic material, or a polymer material such as polyimide. In some examples, the interposer 804 may be formed of alternate rigid or flexible materials that may include the same materials described above for use in a semiconductor substrate, such as silicon, germanium, and other group III-V and group IV materials. The interposer 804 may include metal interconnects 808 and vias 810, including but not limited to through-silicon vias (TSVs) 806. The interposer 804 may further include embedded devices 814, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 804. The package-on-interposer structure 836 may take the form of any of the package-on-interposer structures known in the art.

The IC device assembly 800 may include an IC package 824 coupled to the first face 840 of the circuit board 802 by coupling components 822. The coupling components 822 may take the form of any of the examples discussed above with reference to the coupling components 816, and the IC package 824 may take the form of any of the examples discussed above with reference to the IC package 820.

The IC device assembly 800 illustrated in FIG. 8 includes a package-on-package structure 834 coupled to the second face 842 of the circuit board 802 by coupling components 828. The package-on-package structure 834 may include a first IC package 826 and a second IC package 832 coupled together by coupling components 830 such that the first IC package 826 is disposed between the circuit board 802 and the second IC package 832. The coupling components 828, 830 may take the form of any of the examples of the coupling components 816 discussed above, and the IC packages 826, 832 may take the form of any of the examples of the IC package 820 discussed above. The package-on-package structure 834 may be configured in accordance with any of the package-on-package structures known in the art.

Figure 9:
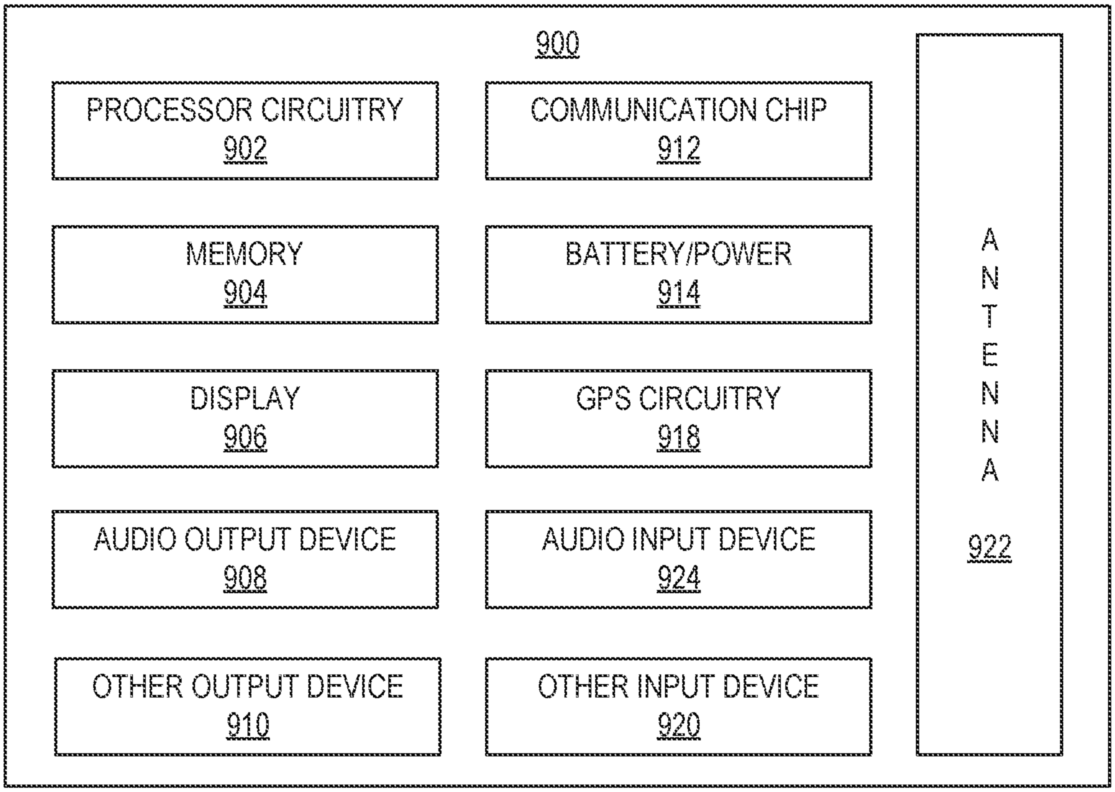
FIG. 9 is a block diagram of an example electrical device that may include an IC package constructed in accordance with teachings disclosed herein.

FIG. 9 is a block diagram of an example electrical device 900 that may include one or more of the example IC package 100 of FIG. 1 and/or the example IC package 400 of FIG. 4. For example, any suitable ones of the components of the electrical device 900 may include one or more of the device assemblies 800, IC devices 750, or dies 702 disclosed herein, and may be arranged in the example IC package 100 of FIG. 1 and/or the example IC package 400 of FIG. 4. A number of components are illustrated in FIG. 9 as included in the electrical device 900, but any one or more of these components may be omitted or duplicated, as suitable for the application. In some examples, some or all of the components included in the electrical device 900 may be attached to one or more motherboards. In some examples, some or all of these components are fabricated onto a single system-on-a-chip (SoC) die.

Additionally, in various examples, the electrical device 900 may not include one or more of the components illustrated in FIG. 9, but the electrical device 900 may include interface circuitry for coupling to the one or more components. For example, the electrical device 900 may not include a display 906, but may include display interface circuitry (e.g., a connector and driver circuitry) to which a display 906 may be coupled. In another set of examples, the electrical device 900 may not include an audio input device 924 (e.g., microphone) or an audio output device 908 (e.g., a speaker, a headset, earbuds, etc.), but may include audio input or output device interface circuitry (e.g., connectors and supporting circuitry) to which an audio input device 924 or audio output device 908 may be coupled.

The electrical device 900 may include a processor circuitry 902 (e.g., one or more processing devices). As used herein, the term "processing device" or "processor" may refer to any device or portion of a device that processes electronic data from registers and/or memory to transform that electronic data into other electronic data that may be stored in registers and/or memory. The processor circuitry 902 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 900 may include a memory 904, which may itself include one or more memory devices such as volatile memory (e.g., dynamic random access memory (DRAM)), nonvolatile memory (e.g., read-only memory (ROM)), flash memory, solid state memory, and/or a hard drive. In some examples, the memory 904 may include memory that shares a die with the processor circuitry 902. This memory may be used as cache memory and may include embedded dynamic random access memory (eDRAM) or spin transfer torque magnetic random access memory (STT-MRAM).

In some examples, the electrical device 900 may include a communication chip 912 (e.g., one or more communication chips). For example, the communication chip 912 may be configured for managing wireless communications for the transfer of data to and from the electrical device 900. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some examples they might not.

The communication chip 912 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 912 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 912 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 912 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 912 may operate in accordance with other wireless protocols in other examples. The electrical device 900 may include an antenna 922 to facilitate wireless communications and/or to receive other wireless communications (such as AM or FM radio transmissions).

In some examples, the communication chip 912 may manage wired communications, such as electrical, optical, or any other suitable communication protocols (e.g., the Ethernet). As noted above, the communication chip 912 may include multiple communication chips. For instance, a first communication chip 912 may be dedicated to shorter-range wireless communications such as Wi-Fi or Bluetooth, and a second communication chip 912 may be dedicated to longer-range wireless communications such as global positioning system (GPS), EDGE, GPRS, CDMA, WiMAX, LTE, EV-DO, or others. In some examples, a first communication chip 912 may be dedicated to wireless communications, and a second communication chip 912 may be dedicated to wired communications.

The electrical device 900 may include battery/power circuitry 914. The battery/power circuitry 914 may include one or more energy storage devices (e.g., batteries or capacitors) and/or circuitry for coupling components of the electrical device 900 to an energy source separate from the electrical device 900 (e.g., AC line power).

The electrical device 900 may include a display 906 (or corresponding interface circuitry, as discussed above). The display 906 may include any visual indicators, such as a heads-up display, a computer monitor, a projector, a touchscreen display, a liquid crystal display (LCD), a light-emitting diode display, or a flat panel display.

The electrical device 900 may include an audio output device 908 (or corresponding interface circuitry, as discussed above). The audio output device 908 may include any device that generates an audible indicator, such as speakers, headsets, or earbuds.

The electrical device 900 may include an audio input device 924 (or corresponding interface circuitry, as discussed above). The audio input device 924 may include any device that generates a signal representative of a sound, such as microphones, microphone arrays, or digital instruments (e.g., instruments having a musical instrument digital interface (MIDI) output).

The electrical device 900 may include GPS circuitry 918. The GPS circuitry 918 may be in communication with a satellite-based system and may receive a location of the electrical device 900, as known in the art.

The electrical device 900 may include any other output device 910 (or corresponding interface circuitry, as discussed above). Examples of the other output device 910 may include an audio codec, a video codec, a printer, a wired or wireless transmitter for providing information to other devices, or an additional storage device.

The electrical device 900 may include any other input device 920 (or corresponding interface circuitry, as discussed above). Examples of the other input device 920 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 900 may have any desired form factor, such as a hand-held or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server or other networked computing component, a printer, a scanner, a monitor, a set-top box, an entertainment control unit, a vehicle control unit, a digital camera, a digital video recorder, or a wearable electrical device. In some examples, the electrical device 900 may be any other electronic device that processes data.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements or method actions may be implemented by, e.g., the same entity or object. Additionally, although individual features may be included in different examples or claims, these may possibly be combined, and the inclusion in different examples or claims does not imply that a combination of features is not feasible and/or advantageous.

From the foregoing, it will be appreciated that example systems, methods, apparatus, and articles of manufacture have been disclosed that produce integrated circuit (IC) packages with grounding members. Examples disclosed herein produce grounding members at first and second sides of a semiconductor substrate to provide additional signal return paths through the semiconductor substrate, thus reducing crosstalk between adjacent through silicon vias (TSVs) in the semiconductor substrate and, further, reducing a required pitch between the adjacent TSVs. Advantageously, the disclosed systems, methods, apparatus, and articles of manufacture improve the efficiency of using a computing device by enabling the reduction in the pitch and/or spacing of TSVs in a semiconductor die, thus increasing a number of the TSVs that can be implemented in a given IC package and, as a result, improving connectivity and speed of communication therein. Disclosed systems, methods, apparatus, and articles of manufacture are accordingly directed to one or more improvement(s) in the operation of a machine such as a computer or other electronic and/or mechanical device.

Example methods, apparatus, systems, and articles of manufacture to produce integrated circuit packages with grounding members are disclosed herein. Further examples and combinations thereof include the following:

Example 1 includes a semiconductor die comprising a semiconductor substrate, metal interconnects proximate a first side of the semiconductor substrate, a metal contact proximate a second side of the semiconductor substrate opposite the first side, a first grounding member extending from a grounding interconnect of the metal interconnects to a first distal point in the semiconductor substrate, and a second grounding member extending from the metal contact to a second distal point in the semiconductor substrate, the first distal point closer to the first side of the semiconductor substrate than the second distal point is to the first side of the semiconductor substrate.

Example 2 includes the semiconductor die of example 1, wherein the first and second grounding members extend into the semiconductor substrate by at least example 0 includes 5 microns and up to 1 micron.

Example 3 includes the semiconductor die of example 1, wherein a width of the first and second grounding members is between example 0 includes 7 microns and example 1 includes 2 microns.

Example 4 includes the semiconductor die of example 1, wherein at least one of the first grounding member or the second grounding member includes a pillar.

Example 5 includes the semiconductor die of example 1, wherein at least one of the first grounding member or the second grounding member includes a trench.

Example 6 includes the semiconductor die of example 1, further including a barrier metal in the semiconductor substrate to envelop a portion of at least one of the first grounding member or the second grounding member.

Example 7 includes the semiconductor die of example 6, wherein the barrier metal includes at least one of tantalum or titanium.

Example 8 includes the semiconductor die of example 1, further including a doped region in the semiconductor substrate surrounding at least one of the first grounding member or the second grounding member.

Example 9 includes the semiconductor die of example 1, wherein the first grounding member is included in a first plurality of first grounding members extending into the first side of the semiconductor substrate and the second grounding member is included in a second plurality of second grounding members extending into the second side of the semiconductor substrate, a first number of members in the first plurality of first grounding members greater than a second number of members in the second plurality of second grounding members.

Example 10 includes the semiconductor die of example 1, wherein the metal contact is coupled to a through-silicon via (TSV) extending between the first side and the second side of the semiconductor substrate, the first and second grounding members electrically coupled to the TSV.

Example 11 includes the semiconductor die of example 1, wherein the second grounding member extends through an isolation layer disposed between the second side of the semiconductor substrate and the metal contact.

Example 12 includes a method to manufacture a semiconductor die, the method comprising providing a first grounding member in a semiconductor substrate, the first grounding member to extend from a first distal point in the semiconductor substrate to a grounding interconnect adjacent a first side of the semiconductor substrate, and providing a second grounding member in the semiconductor substrate, the second grounding member to extend from a second distal point in the semiconductor substrate to a metal contact proximate a second side of the semiconductor substrate, the first distal point closer to the first side of the semiconductor substrate than the second distal point is to the first side of the semiconductor substrate.

Example 13 includes the method of example 12, further including fabricating a through-silicon via (TSV) in the semiconductor substrate, the TSV extending between the first and second sides of the semiconductor substrate, the TSV electrically coupled to the first and second grounding members.

Example 14 includes the method of example 12, further including adding at least one of barrier metal regions or doped regions adjacent the first and second sides of the semiconductor substrate, the first and second grounding members extending into the at least one of the barrier metal regions or the doped regions.

Example 15 includes the method of example 12, further including fabricating at least one transistor in a device layer on the first side of the semiconductor substrate, the first grounding member to extend through the device layer.

Example 16 includes the method of example 15, further including fabricating a routing layer on the device layer, the routing layer to include the grounding interconnect.

Example 17 includes an integrated circuit (IC) package comprising a first die, a second die including a through-silicon via (TSV) extending between first and second sides of the second die, the first die stacked on the first side of the second die, the TSV electrically coupled to the first die, a metal contact on the second side of the package die and electrically coupled to the TSV, and grounding members adjacent the first and second sides of the second die, the grounding members partially extending into a bulk semiconductor region of the second die, a first one of the grounding members extending from the metal contact.

Example 18 includes the IC package of example 17, wherein the grounding members extend into a barrier metal embedded in the bulk semiconductor region adjacent the first and second sides.

Example 19 includes the IC package of example 17, further including metal interconnects adjacent the first side, a second one of the grounding members extending from a grounding interconnect of the metal interconnects.

Example 20 includes the IC package of example 19, further including one or more transistors in a device layer between the first side of the bulk semiconductor region and the metal interconnects, the second one of the grounding members to extend through the device layer.

Example 21 includes the IC package of example 17, wherein a portion of the grounding members extending into the bulk semiconductor region is not electrically isolated from the bulk semiconductor region.

The following claims are hereby incorporated into this Detailed Description by this reference. Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

What is claimed is:

1. A semiconductor die comprising:

a semiconductor substrate including a region of semiconductor material;

metal interconnects, a first side of the region facing towards the metal interconnects;

a metal contact, a second side of the region facing towards the metal contact, the second side opposite the first side;

a first grounding member extending from a grounding interconnect of the metal interconnects to a first end of the first grounding member, the first grounding member extending into the semiconductor material such that the first end is at a first point in the region; and a second grounding member extending from the metal contact to a second end of the second grounding member, the second grounding member extending into the semiconductor material such that the second end is at a second point in the region, the first point closer to the first side of the region than the second point is to the first side of the region such that the first and second grounding members are spaced apart with a portion of the region therebetween.

2. The semiconductor die of claim 1, wherein the first and second grounding members extend into the region by at least 0.5 microns and up to 1 micron.

3. The semiconductor die of claim 1, wherein a width of the first and second grounding members is between 0.7 microns and 1.2 microns.

4. The semiconductor die of claim 1, wherein at least one of the first grounding member or the second grounding member includes a pillar.

5. The semiconductor die of claim 1, wherein at least one of the first grounding member or the second grounding member includes a trench.

6. The semiconductor die of claim 1, including a barrier metal in the region to envelop a portion of at least one of the first grounding member or the second grounding member.

7. The semiconductor die of claim 6, wherein the barrier metal includes at least one of tantalum or titanium.

8. The semiconductor die of claim 1, including a doped region in the region of the semiconductor material, the doped region surrounding at least one of the first grounding member or the second grounding member.

9. The semiconductor die of claim 1, wherein the first grounding member is included in a first plurality of first grounding members extending into the first side of the region and the second grounding member is included in a second plurality of second grounding members extending into the second side of the region, a first number of members in the first plurality of first grounding members greater than a second number of members in the second plurality of second grounding members.

10. The semiconductor die of claim 1, wherein the metal contact is coupled to a through-silicon via (TSV) extending between the first side and the second side of the region, the first and second grounding members electrically coupled to the TSV.

11. The semiconductor die of claim 1, wherein the second grounding member extends through an isolation layer between the second side of the region and the metal contact.

12. An integrated circuit (IC) package comprising:

a first die;

a second die including a through-silicon via (TSV) extending between first and second sides of the second die, the first die stacked on the first side of the second die, the TSV electrically coupled to the first die;

a metal contact on the second side of the second die and electrically coupled to the TSV;

a first grounding member extending into a bulk semiconductor region of the second die from the first side of the second die, the first grounding member extending less than halfway through the bulk semiconductor region; and a second grounding member extending into the bulk semiconductor region from the second side of the second die, the second grounding member extending less than halfway through the bulk semiconductor region.

13. The IC package of claim 12, including at least one portion of a barrier metal embedded in the bulk semiconductor region, the at least one portion of the barrier metal to separate at least one of the first or second grounding members from a material of the bulk semiconductor region.

14. The IC package of claim 12, including metal interconnects adjacent the first side, the first grounding member extending from a grounding interconnect of the metal interconnects.

15. The IC package of claim 14, including one or more transistors in a device layer between the bulk semiconductor region and the metal interconnects, the first grounding member to extend through the device layer.

16. The IC package of claim 12, wherein a portion of at least one of the first or second grounding members extending into the bulk semiconductor region is not electrically isolated from the bulk semiconductor region.

17. The IC package of claim 12, wherein the first and second grounding members respectively extend into the bulk semiconductor region by no more than 1 micron.

18. The IC package of claim 12, wherein a portion of the bulk semiconductor region is in a gap between closest ends of the first and second grounding members, the gap extending in a direction parallel to a length of the TSV.

19. A semiconductor die comprising:

metal interconnects on a first side of a bulk semiconductor region;

a first grounding member extending from the metal interconnects into the bulk semiconductor region, the first grounding member extending less than halfway through the bulk semiconductor region;

a contact on a second side of the bulk semiconductor region;

a through-silicon via (TSV) extending from the contact to beyond the first side of the bulk semiconductor region; and a second grounding member extending from the contact into the bulk semiconductor region, the second grounding member spaced apart from the TSV in a direction transverse to a length of the TSV, the second grounding member extending less halfway through the bulk semiconductor region.

20. The semiconductor die of claim 19, wherein a first portion of the bulk semiconductor region is between the first grounding member and the second side of the bulk semiconductor region, the first portion axially aligned with a longitudinal length of the first grounding member, a second portion of the bulk semiconductor region is between the second grounding member and the first side of the bulk semiconductor region, the second portion axially aligned with a longitudinal length of the second grounding member, a material of the bulk semiconductor region extending continuously from the first portion to the second portion.

21. The semiconductor die of claim 20, including a barrier material in the bulk semiconductor region, a first portion of the barrier material between the first grounding member and the first portion of the bulk semiconductor region, a second portion of the barrier material between the second grounding member and the second portion of the bulk semiconductor region.

* * * * *